United States Patent [19]

Peters

[11] Patent Number: 4,474,829

[45] Date of Patent: Oct. 2, 1984

[54] LOW-TEMPERATURE CHARGE-FREE PROCESS FOR FORMING NATIVE OXIDE LAYERS

[75] Inventor: John W. Peters, Malibu, Calif.

[73] Assignee: Hughes Aircraft Company, El Segundo, Calif.

[21] Appl. No.: 517,930

[22] Filed: Jul. 28, 1983

Related U.S. Application Data

[63] Continuation of Ser. No. 323,780, Nov. 23, 1981, abandoned.

[51] Int. Cl.$^3$ ............................................. B05D 3/06
[52] U.S. Cl. .................................... 427/53.1; 148/6.3; 204/157.1 R; 427/54.1; 427/82; 427/93; 427/248.1; 427/255; 427/399
[58] Field of Search ................ 204/157.1 R; 427/53.1, 427/54.1, 82, 85, 86, 87, 91, 93, 95, 248.1, 255, 255.3, 399; 148/6.3, 6

[56] References Cited

U.S. PATENT DOCUMENTS

| | | | |
|---|---|---|---|
| 4,232,057 | 11/1980 | Ray et al. | 427/39 |
| 4,265,932 | 5/1981 | Peters et al. | 427/53.1 |
| 4,267,205 | 5/1981 | Pastor et al. | 427/82 |

FOREIGN PATENT DOCUMENTS 38-21456 10/1963 Japan .................................. 427/54.1

OTHER PUBLICATIONS

Kern et al., "Advances in Deposition Processes for Passivation Films", J. Vac. Sci. Technol., vol. 14, pp. 1082-1099, 1977.

Primary Examiner—Sadie L. Childs
Attorney, Agent, or Firm—Mary E. Lachman; A. W. Karambelas

[57] ABSTRACT

The specification discloses a low-temperature, charge-free process for forming a layer of a native oxide on the surface of a substrate of a chosen semiconductor material. The substrate is exposed to neutral, charge-free oxygen atoms that are the primary oxidizing species and are formed in a manner which eliminates the generation of charged particles or high energy radiation. These oxygen atoms then react with the surface of the substrate to form the native oxide thereof. The use of neutral oxygen atoms avoids damage to the substrate due to exposure to charged particles or high energy radiation, both in the manner in which the oxidizing species is formed and in the manner in which the native oxide layer is grown. In a preferred embodiment, the neutral oxygen atoms are formed by exposing a chosen oxygen-containing precursor to radiation of a selected wavelength to cause the direct dissociation of the precursor to generate oxygen solely in atomic form.

15 Claims, 1 Drawing Figure

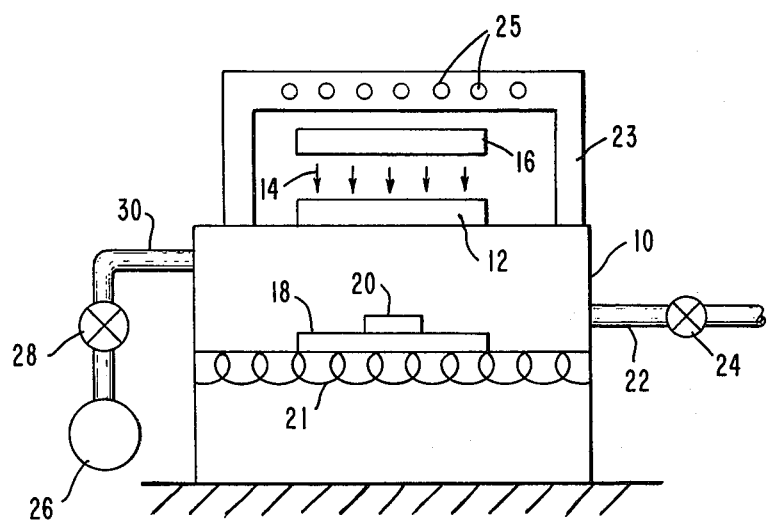

LOW-TEMPERATURE CHARGE-FREE PROCESS FOR FORMING NATIVE OXIDE LAYERS

This application is a continuation of application Ser. No. 323,780, filed Nov. 23, 1981, abandoned.

BACKGROUND OF THE INVENTION

1. Field of the Invention

This invention relates generally to the manufacture of semiconductor devices and, more particularly, to a process for forming a native oxide layer on the surface of a selected semiconductor material, at a low temperature and using non-ionizing radiation.

2. Description of the Prior Art

In the manufacture of semiconductor devices, it is often necessary to form an insulator layer on the surface of a semiconductor substrate to provide electrical insulation between adjacent layers or structures. In certain cases, it has been found that it is desirable to form a native oxide layer on the surface of the semiconductor substrate prior to the deposition of the insulator layer, in order to enhance the interface properties between the semiconductor and the insulator in the device formed therefrom. More specifically, both the surface state density at the semiconductor/insulator interface and the incorporation of fixed charge at this interface can be decreased by forming a native oxide layer on the surface of selected semiconductor substrates, such as indium phosphide, mercury cadmium telluride, or indium antimonide, prior to deposition of the insulator layer. The term "native oxide" is used herein to designate an oxide generated by the conversion of the top surface of the semiconductor substrate (approximately 10 to 100 angstroms) to the corresponding oxide. The term "fixed charge" is used herein to designate positive and negative uncompensated charges located in the native oxide due to defects, dangling bonds, or impurities generated during formation of the native oxide.

One method by which native oxide layers may be grown comprises a wet chemical anodization process, in which the semiconductor substrate to be coated with a native oxide is made the anode in an electrolytic cell, and a current is passed through a selected electrolyte, to thereby cause the native oxide layer to form on the semiconductor substrate. For example, in the formation of the native oxide of mercury cadmium telluride (HgCdTe), a suitable electrolyte would be a hydrogen peroxide and bromine solution or a hydrogen peroxide and acetone solution. Such an anodization process for the formation of a native oxide layer on a gallium arsenide substrate is described, for example, by L. Meiners, in the publication entitled "Surface potential of anodized p-GaAs MOS Capacitors," in *Applied Physics Letters*, Vol. 33, No. 8, 15 October 1978, pages 747-748. However, anodically grown native oxide layers are, in many cases, unacceptable for device passivation purposes due to the incorporation of fixed and mobile charge in the native oxide. The term "mobile charge" is used herein to designate atmospherically generated contamination, such as sodium or potassium ions, which have a relatively high mobility through the insulator. In addition, in anodically grown native oxide layers, sodium ions or other impurity ions from the electrolytic bath may become incorporated in the native oxide layer formed. These fixed charges create high surface state densities ($N_{ss}$) at the interface of the semiconductor with the native oxide/insulator composite in the subsequently formed device. (The term "native oxide/insulator composite" is used herein to designate the composite comprising the native oxide layer and the insulator layer formed thereon.) The high surface state densities at this latter interface will trap charges when a voltage is applied to the device, thereby preventing optimum device performance.

Another method by which a native oxide layer may be formed is a low temperature plasma process, in which reactive oxygen ions, for example, are produced by the action of an electric field, and the oxygen ions impinge on the semiconductor surface to cause the oxidation thereof, as described, for example, in U.S. Pat. No. 3,650,929 to K. Lertes and by N. Yokoyama et al. in the publication entitled "Low-temperature plasma oxidation of GaAs", in *Applied Physics Letters*, Vol. 32, No. 1, 1 January 1978, pages 58-60. Optionally, using a plasma anodization process, a bias voltage may be applied to the substrate during exposure to a plasma of oxygen ions to form a native oxide on the substrate, as described, for example, by L. A. Chesler and G. Y. Robinson, in the publication entitled "Plasma anodization of GaAs in a dc discharge", in the *Journal of Vacuum Science and Technology*, Vol. 15, No. 4, July/August 1978, pages 1525-1529. However, both plasma methods for native oxide growth discussed above impart charging and radiation damage to the semiconductor surface, and cause degraded semiconductor/insulator interface characteristics, such as high surface state density and incorporation of fixed charge. More specifically, in the previously described processes for the formation of a native oxide layer using a plasma of oxygen ions, in addition to the oxygen ions which are formed, numerous extraneous ionized and neutral particles, as well as high energy radiation with wavelengths as low as 500 angstroms and even extending into the soft x-ray region are produced and bombard the surface of the substrate on which the oxide is being formed. If the substrate comprises a sensitive device type, such as a charge-coupled device or a device formed of certain compound semiconductors (e.g. HgCdTe, InSb, or GaAs), the above-described charged particles and unwanted radiation frequently impart damage to these sensitive devices. In addition, the plasma may result in the incorporation of fixed charge in the insulator, which, in turn, will induce high surface state densities at the interface of the semiconductor with the native oxide/insulator composite, which will degrade device performance. Finally, thermal damage due to the selective absorption of radiation by the substrate and resultant heating thereof during plasma processing can lead to out-diffusion of one or more of the constituent elements of a compound semiconductor substrate, such as mercury in mercury cadmium telluride.

Thus, both the anodic process and the plasma process for forming a native oxide layer have the undesired effect of causing the incorporation of fixed or mobile charge in the native oxide so formed, which, in turn, contributes to a high surface state density at the interface of the semiconductor with the native oxide/insulator composite and degraded device performance. This prior art problem of the incorporation of fixed or mobile charge in the native oxide layer formed is due to exposure to charged particles or species (e.g. ions or electrons) or high energy radiation, and is caused by the manner in which the oxidizing species is formed and by the manner in which the native oxide layer is grown. It is the alleviation of this prior art problem of the incorporation of charge in a native oxide layer to which the present invention is directed.

SUMMARY OF THE INVENTION

I have previously discovered the solution to a similar prior art problem associated with substrate damage due to charge bombardment or radiation bombardment during the deposition of an oxide layer on a selected substrate, which is described in U.S. Pat. No. 4,371,587, assigned to the present assignee. This latter process comprises a low-temperature chemical vapor deposition process in which the substrate is exposed to a selected vapor phase reactant in the presence of neutral (un-ionized) oxygen atoms. The oxygen atoms react with the vapor phase reactant to form the desired oxide, which deposits as a layer on the substrate. The use of neutral oxygen atoms in the above-described process avoids damage to the substrate due to charge bombardment and radiation bombardment. In one embodiment of the invention just described, the neutral oxygen atoms are formed by a photochemical reaction.

The general purpose of the present invention is to provide a new and improved process for forming a layer of a native oxide of a chosen semiconductor material on the surface of a substrate thereof by a low-temperature, charge-free process. This process possesses most, if not all, of the advantages of the above-discussed prior art native oxide formation processes, while overcoming their above-mentioned significant disadvantages.

The above general purpose of this invention is accomplished by exposing a substrate of the chosen semiconductor material to neutral, charge-free oxygen atoms as the primary oxidizing species and which are formed in a manner which eliminates the generation of charged particles or high energy radiation. These oxygen atoms then react with the surface of the substrate to form the native oxide thereof. The use of neutral oxygen atoms avoids damage to the substrate due to exposure to charged particles or high energy radiation. In a preferred embodiment of the present invention, the neutral oxygen atoms are formed by a photochemical reaction produced by exposing a chosen oxygen-containing precursor to radiation of a selected wavelength to cause the direct dissociation of the precursor to generate oxygen solely in atomic form.

Accordingly, it is a purpose of the present invention to provide a new and improved process for forming a layer of a native oxide of a chosen semiconductor material by a novel low-temperature, charge-free process which eliminates the generation of charged particles and high energy radiation that cause damage to the substrate during native oxide formation.

Another purpose of the present invention is to provide a process of the type described which minimizes the incorporation of fixed or mobile charges in the native oxide formed and minimizes the value of the surface state density at the interface of the semiconductor and the native/oxide insulator composite in the device formed therefrom.

Still, another purpose is to provide a process of the type described which can be performed at a temperature as low as room temperature (e.g. 30° C.), and thus eliminates the problem of out-diffusion of a constituent element of certain compound semiconductor materials, which is encountered at higher temperatures.

Yet another purpose of the present invention is to provide a passivated semiconductor device having optimized electrical interface properties, formed by growing a native oxide layer on the surface of a selected substrate by the process described above and then depositing a layer of a selected dielectric passivation material on the native oxide layer.

A unique feature of the present invention is that neutral (un-ionized) oxygen atoms may be formed as the sole oxidizing species by a photochemical reaction and used to accomplish native oxide formation.

Another feature of the present invention is that damage to the substrate is avoided both in the manner in which the oxidizing species is formed and in the type of oxidizing species used to accomplish native oxide growth.

The foregoing and other advantages and features of the present invention will be apparent from the following more particular description of the preferred embodiments of the invention, as illustrated in the accompanying drawing.

BRIEF DESCRIPTION OF THE DRAWING

The FIGURE illustrates, in schematic form, one preferred apparatus for carrying out one process embodiment of the present invention.

DETAILED DESCRIPTION OF THE INVENTION

The FIGURE shows, in simplified form, one apparatus suitable for implementation of one process embodiment of the present invention, in which neutral oxygen atoms are formed by a direct photochemical dissociation of a selected oxygen-containing precursor, such as nitrous oxide, molecular oxygen, or nitrogen dioxide. A reaction chamber 10, in which the photochemical reaction occurs, is provided with a quartz window 12, which is integral with the top surface of the reaction chamber 10. The quartz window 12 is transmissive to the selected wavelength of radiation used to initiate the desired photochemical reaction to be discussed below. This radiation 14 of a selected wavelength is produced by the radiation-producing means 16, which may be, for example, an array of low pressure mercury vapor arc lamps. Within the reaction chamber 10, there is a substrate holder 18, which receives a substrate 20, formed of a chosen material such as mercury cadmium telluride, onto which the desired native oxide layer is to be formed.

External to the reaction chamber 10 and adjacent to the bottom surface thereof, there are heating elements 21, which may be formed, for example, of Nichrome wire and are activated by applying a controlled voltage thereto. The heating elements 21 may be used optionally to heat the substrate 20 to the required temperature so that appropriate properties of the grown native oxide layer, such as density, may be obtained. The temperature in the chamber 10 may be maintained as low as room temperature (i.e. 30° C.) or as high as required (e.g. 300° C.), while still being compatible with the substrate material. However, since mercury vapor arc lamps, for example, become less efficient at increased temperatures, it is necessary to provide external water cooling or an external air or nitrogen cooling source to cool these lamps and remove radiant heat produced by the substrate 20 and substrate holder 18 at certain elevated temperatures. For this purpose, the radiation-producing means 16 is completely contained within the enclosure 23, which may be formed of aluminum; and an external cooling means 25, such as pipes with water flowing therethrough as shown in the figure or flowing nitrogen gas, is activated to apply cooling to the enclosure 23. The enclosure 23 is secured to the outside surface of the reaction chamber 10 which is adjacent the quartz window 12, but may be removed therefrom as required. Thus, the processing temperature is maintained at a level such that sufficient cooling of the mercury lamps can be accomplished in order to provide efficient lamp performance. In addition, the enclosure 23 eliminates the formation of ozone which would occur if the radiation 14 were allowed to contact molecular oxygen in the open atmosphere, to form atomic oxygen which would react with additional molecular oxygen in the open atmosphere to form ozone. The enclosure 23 also provides eye protection to the operator from the radiation 14.

Leading from the reaction chamber 10, there is a tube 22 which passes through a valve 24 and then to a vacuum-producing means, such as a pump (not shown), which is used to evacuate the chamber 10 to a sufficiently low pressure to allow the photochemical reaction to occur.

External to the reaction chamber 10 there is a chamber 26 which contains the selected oxygen-containing molecular precursor, such as nitrous oxide ($N_2O$), nitrogen dioxide ($NO_2$), or molecular oxygen ($O_2$). The chamber 26 is connected to a control valve or flow meter 28, which is used to control the amount of precursor that is introduced into a tube 30. The precursor flows through the tube 30 into the reaction chamber 10, where the photochemical reaction may be brought about. The components of the apparatus shown in the figure may be constructed of stainless steel or aluminum unless otherwise specified.

In practicing one process embodiment of the present invention, a photochemical reaction is brought about as generally described in U.S. Pat. No. 4,371,587 and further discussed in the book entitled "Photochemistry" by J. G. Calvert and J. N. Pitts, Jr., John Wiley and Sons, Inc., New York, 1966, both references being incorporated herein by reference. The reaction chamber 10, which contains the selected substrate 20, is evacuated by the vacuum-producing means (not shown) to a predetermined pressure, for example, 1 to 4 torr. The selected oxygen-containing molecular precursor is placed in the chamber 26 and the valve 28 is set so that the precursor may flow from the reaction chamber 26 through the tube 30 and then into the reaction chamber 10. The reaction chamber 10 may be maintained at approximately room temperature (e.g. 30° C.) or at higher temperatures (e.g., 200° C.). The radiation-producing means 16 is activated to produce the radiation 14 of a selected wavelength required to produce the desired photochemical reaction (e.g. 1849Å for nitrous oxide). The radiation 14 passes into the reaction chamber 10, where it causes the direct dissociation of the selected oxygen-containing precursor, such as $N_2O$, into atomic oxygen, which then reacts with the surface of the substrate 20 of a selected semiconductor material to form the native oxide thereof.

The atomic oxygen required for the process of the present invention may be formed from the selected oxygen-containing precursor by the discrete absorption of photonic energy, as shown, for example, in Equations (1), (2), or (3) listed below for nitrous oxide, molecular oxygen, and nitrogen dioxide, respectively. The designation $O(^1D)$ in these equations refers to an oxygen atom in an energized singlet D state having one electron volt of energy in excess of the ground state and which decays, upon collision with the appropriate third body gas or the wall of the reaction chamber, to the ground state, a triplet P state designated $O(^3P)$. In the case of nitrogen dioxide ($NO_2$) shown in Equation (3), the oxygen atom is formed directly in the ground or triplet P state.

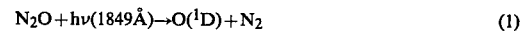
$$N_2O + h\nu(1849Å) \rightarrow O(^1D) + N_2 \quad (1)$$
where
h = Planck's constant
v = frequency of absorbed radiation

$$O_2 + h\nu(1849Å) \rightarrow 2O(^3P) \quad (2)$$

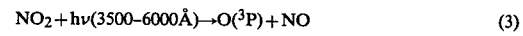
$$NO_2 + h\nu(3500-6000Å) \rightarrow O(^3P) + NO \quad (3)$$

In the case where molecular oxygen is used as the precursor to form atomic oxygen as shown in Equation (2) above, the operating pressure and flow rate of the molecular oxygen must be carefully controlled in order to avoid the formation of ozone. If excess molecular oxygen is present when the atomic oxygen is generated, these two species react to form ozone, which would oxidize the substrate surface. However, oxides formed by oxidation with ozone may have undesirable qualities such as granularity and poor surface morphology. Consequently, it is advantageous to avoid the presence of ozone during the process of the present invention.

The atomic oxygen formed in accordance with the present invention then reacts with the substrate, such as HgCdTe, to form the native oxide thereof in accordance with Equation (4) below.

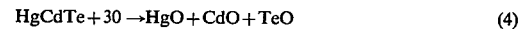
$$HgCdTe + 3O \rightarrow HgO + CdO + TeO \quad (4)$$

In accordance with the reactions shown in Equation (1), (2) and (3) above, oxygen is generated solely in atomic form. In the case of a nitrous oxide precursor, as shown in Equation (1) above, atomic oxygen is the sole oxidizing species which is generated by this photochemical reaction and which subsequently reacts with the substrate surface to form the desired native oxide in accordance with the present invention. However, in the case of a molecular oxygen precursor, as shown in Equation (2) and discussed above, while atomic oxygen is the sole oxidizing species which is photochemically generated, some ozone might subsequently be formed by reaction of atomic oxygen with molecular oxygen. Nevertheless, even in the latter case, atomic oxygen is still the primary oxidizing species for forming the native oxide in accordance with the process of the present invention.

Alternatively, the atomic oxygen required in the process of the present invention may be generated by the mercury sensitized photochemical dissociation of a selected oxygen-containing precursor, such as nitrous oxide, nitrogen dioxide, or molecular oxygen under selected pressure and flow rate conditions, as described in U.S. Pat. No. 4,371,587. In this alternative process embodiment of the present invention, the apparatus shown in the figure herein and described previously, is used except that a chamber containing mercury is inserted in the path of the tube 30 prior to its entry into the chamber 10. The oxygen containing precursor thus becomes mixed with mercury vapor and is then introduced into the reaction chamber. The radiation-producing means 16 is activated and produces the radiation 14 of a selected wavelength required to produce the desired photochemical reaction (e.g., 2537Å to produce mercury in an excited state). The radiation 14 passes through the quartz window 12 into the reaction chamber 10, where it excites the mercury (Hg) atoms in the reactant gas mixture to form mercury atoms in an excited state (Hg*), which are approximately 5 electron volts above normal ground state, but unionized. The Hg* then collides with the oxygen-containing precursor, such as $N_2O$, and causes the precursor to dissociate and produce atomic oxygen. The atomic oxygen so formed then reacts with the surface of the substrate to form the native oxide thereof as previously discussed herein. However, it is anticipated that in this alternative process embodiment mercury oxide (HgO) will form during the native oxide formation and may cause contamination of the latter. Optionally, other known photosensitizing agents besides mercury may be used provided such photosensitizers do not produce byproducts which noticeably contaminate the native oxide.

By the above-described process of the present invention, oxygen atoms are produced by a photochemical process which generates only neutral particles. Thus, the prior art problem associated with the generation of charged particles and high energy radiation which cause damage to the substrate as previously discussed herein has been eliminated. The incorporation of fixed or mobile charges in the native oxide layer formed is minimized by the process of the present invention and the value of the surface state density at the interface of the semiconductor substrate with the native oxide/insulator composite subsequently formed is minimized. In addition, a low density of generation/recombination centers (i.e., dangling bonds or traps) is produced and thus good minority carrier lifetime is achieved in devices formed using the process of the present invention. For the reasons discussed immediately above, the process of the present invention is referred to as a "charge-free" process. Thus, the process of the present invention avoids damage to the substrate both in the manner in which the oxidizing species is formed and in the manner in which this oxidizing species is reacted with the substrate to form the desired native oxide.

Moreover, the prior art problem of plasma-induced heating is eliminated by the process of the present invention since selective absorption of radiation by the substrate does not occur in the process described herein. Further, the problem of thermal damage to certain compound semiconductor substrates due to out-diffusion has been minimized by the process of the present invention since a temperature as low as room temperature may be used in the process described herein. In addition, the problem of boundary migration has been eliminated since the process of the present invention can be conducted at a relatively low temperature; and the associated problem of decreased device yield encountered in the high temperature fabrication of high density devices, such as very large scale integrated circuits and very high speed integrated circuits, has been avoided.

Further, the process of the present invention provides enhanced protection against device damage due to radiation (i.e., from a cobalt-60 source) by minimizing the creation of dangling bonds and traps during the formation of the native oxide layer. These traps and dangling bonds normally increase the susceptibility of the device to radiation damage and, thus, their minimization minimizes the radiation damage.

The process of the present invention is, to my knowledge, the first demonstration of the use of a photochemical process for the formation of a native oxide layer on a chosen substrate.

Using the above-described process, the present invention may be used to form the native oxide of such semiconductor materials as: mercury cadmium telluride (HgCdTe), gallium aluminum arsenide (GaAlAs), indium gallium arsenide (InGaAs), indium gallium phosphide (InGaP), indium phosphide (InP), indium antimonide (InSb), gallium arsenide (GaAs), gallium antomonide (GaSb), gallium phosphide (GaP), silicon (Si), and germanium (Ge).

Further, it has been found that prior to the formation of the native oxide in accordance with the process of the present invention, it may be advantageous to use a cleaning process, such as a wet chemical etching process as is known in the art, to provide a clean substrate surface for the formation of the native oxide layer.

After the native oxide layer has been formed by the process of the present invention, a chosen dielectric passivation layer may be formed thereon to provide a device having enhanced semiconductor/insulator interface properties due to the decreased surface state density and the decreased incorporation of fixed and mobile charge therein. Optionally, the substrate may have regions of predetermined conductivity defined therein. The process of the present invention finds particular utility when followed by the process of previously discussed U.S. Pat. No. 4,371,587, by which a desired dielectric oxide layer may be deposited by a photochemical process on the surface of the native oxide layer formed by the process of the present invention. By such a combination of native oxide growth and dielectric layer deposition in a continuous mode in which the vacuum in the reaction chamber is undisturbed and the substrate is not exposed to the atmosphere between successive process steps, recontamination of atmospherically sensitive prepared compound semiconductive surfaces may be prevented. In addition, by using neutral oxygen atoms to form the dielectric oxide layer, the surface of the native oxide can be maintained intact and damage thereto by charge or radiation bombardment can be avoided. The resulting device has optimized electrical properties at the interface of the substrate with the native oxide/insulator composite. In particular, structures having these native oxide layers and dielectric passivation layers may be used in the fabrication of HgCdTe photoconductive and photovoltaic devices, light-emitting diodes, and heterojunction lasers, InSb infrared detectors, and InP high frequency field-effect transistors.

EXAMPLE 1

Using the apparatus illustrated and described in relation to the figure and the process previously described herein, a native oxide layer was formed on a substrate of indium phosphide, using the direct dissociation of molecular oxygen as the oxygen-containing precursor at approximately 30° C., at a flow rate of 100 standard cubic centimeters per minute, and a total system pressure of 1.5 torr. The photochemical reaction was conducted for a period of approximately one hour, to form an InP native oxide layer having a thickness of approximately 20 angstroms. Electron spectroscopic chemical analysis (ESCA) data on the native oxide layer indicated the presence of In-O and P-O bonding.

Next, a dielectric oxide layer was formed atop the native oxide layer in order to provide a metal-insulator-semiconductor (MIS) structure for testing electrical properties. The dielectric oxide layer was silicon dioxide (SiO$_2$) having a thickness of 1,000 Å and formed by the process described in U.S. Pat. No. 4,371,587 using the mercury sensitized photodissociation of nitrous oxide with 2537 Å radiation at 200° C. Aluminum was used for the gate metallization and the backside contact was indium solder. Capacitance-voltage (C-V) measurements were made using procedures known in the art of semiconductor device testing. The measured flatband voltage was within the range of −4.0 to zero volts and the measured hysteresis was approximately 0.5 volt.

For comparison, a test structure similar to that described above was formed except that the native oxide layer of the present invention was omitted. Using the latter structure, the measured flatband voltage was within the range of −1.75 to −2.0 volts and the measured hysteresis was approximately 0.5 volt. Thus, the structure using the native oxide of the present invention indicates that improved device performance can be obtained since desirable flatband voltages close to zero volt can be obtained.

EXAMPLE 2

Using the apparatus illustrated and described in relation to the figure and the process previously described herein, a native oxide layer was formed on a substrate of HgCdTe, using the direct dissociation of molecular oxygen as the oxygen-containing precursor at approximately 30° C., at a flow rate of 100 standard cubic centimeters per minute, and a total system pressure of 1.5 torr. The photochemical reaction was conducted for a period of 30 minutes, to form a HgCdTe native oxide layer having a thickness of approximately 30 angstroms. The refractive index of the native oxide layer so formed was determined to be 2.2, which has been empirically determined from known native oxide growth processes to provide optimized interface characteristics and electrical properties.

Next, an insulator layer was formed atop the native oxide layer to provide a MIS structure for testing electrical properties. The insulator was zinc sulfide deposited by known metal evaporation techniques to a thickness of approximately 1000 Å. A chromium-gold alloy was used for the gate metallization. Capacitance-voltage (C-V) measurements were made using procedures known in the art of semiconductor device testing. The measured hysteresis was approximately zero volt and the overall shape of the C-V curve was indicative of low surface state densities. The measured flatband voltage was −5.6 volts.

For comparison, a test structure similar to that described above was formed except that the native oxide layer of the present invention was omitted. Using this conventional structure, the measured hysteresis was 0.5 volts or more, and the flatband voltage was similar to the value given above. Thus, the structure using the native oxide of the present invention has an improved value for hysteresis, although showing no significant improvement in flatband voltage. The latter effect may possibly be due to the different rates of oxidation of the various elements in a compound semiconductor material, which produces a non-stoichiometric native oxide.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the photochemical generation of atomic oxygen, but is intended to include any process in which neutral, charge-free oxygen atoms are formed as the primary oxidizing species and in a manner which avoids the generation of charged particles or high energy radiation that would damage the substrate surface.

Moreover, the scope of the present invention is not limited to the formation of a native oxide layer of indium phosphide or mercury cadmium telluride, which were used merely as examples, but is intended to include the formation of native oxide layers of binary and ternary compound semiconductor materials, such as HgCdTe, GaAlAs, InGaAs, InGaP, InP, InSb, GaAs, GaSb, GaP, as well as elemental semiconductor materials, such as Si and Ge, and any substrate material capable of undergoing native oxide growth by means of atomic oxygen. Nor is the present invention limited to the formation of a native oxide for the specific purpose discussed herein, but includes the formation of a native oxide for any other purposes for which it may be required. In addition, the selected oxygen-containing precursor is not limited to nitrous oxide, nitrogen dioxide, or molecular oxygen under selected pressure and flow rate condition, but is intended to include any material which will photochemically dissociate to produce oxygen solely in atomic form.

Finally, the process of the present invention is not limited to the particular apparatus described herein, which was used merely as an example, but is intended to include any apparatus suitable for conducting a photochemical reaction of the type described herein. The reaction chamber described herein may have any configuration in which at least a portion thereof is formed of quartz or other material which is transmissive to the selected wavelength of radiation and may comprise, for example, a hollow quartz tube. In addition, the scope of the present invention is intended to include the formation of atomic oxygen as described herein, at a location remote from the substrate and subsequent exposure of the substrate to this atomic oxygen.

What is claimed is:

1. A low-temperature, charge-free process for forming a layer of a native oxide of a chosen material on the surface of a substrate of said chosen material, comprising the steps of:
   (a) providing said substrate of said chosen material; and
   (b) exposing said surface of said substrate at a temperature within the range of about 30 to 300° C. and a pressure below atmospheric pressure to an atmosphere comprising neutral, charge-free oxygen atoms as the primary oxidizing species and formed in a manner which eliminates the generation of charged particles or high energy radiation, to bring about a reaction between said oxygen atoms and said surface of said substrate to form said native oxide while simultaneously minimizing damage to said substrate caused by said charged particles or said high energy radiation and minimizing thermal damage to said substrate.

2. The process set forth in claim 1 wherein said oxygen atoms are generated by a photochemical reaction which produces oxygen solely in atomic form.

3. A low-temperature process for forming a layer of a native oxide of a chosen material on the surface of a substrate of said chosen material by a photochemical reaction, comprising the steps of:
(a) providing said substrate of said chosen material; and
(b) exposing said surface of said substrate at a temperature within the range of about 30 to 300° C. to photochemically generated neutral oxygen atoms as the primary oxidizing species, said oxygen atoms being formed by exposing a chosen oxygen-containing precursor at a pressure below atmospheric pressure to radiation of a selected wavelength to cause the direct dissociation of said precursor to form said oxygen atoms, whereby said oxygen atoms react with said surface of said substrate to form said native oxide and said neutral oxygen atoms are formed and said native oxide is formed in a manner which avoids damage to said substrate causes by exposure to charged particles or high energy radiation.

4. The process set forth in claim 3 wherein said oxygen-containing precursor is selected from the group consisting of: nitrous oxide ($N_2O$); nitrogen dioxide ($NO_2$); and molecular oxygen ($O_2$) under selected pressure and flow rate conditions.

5. The process set forth in claim 3 wherein said chosen material is selected from the group consisting of mercury cadmium telluride (HgCdTe), gallium aluminum arsenide (GaAlAs), indium gallium arsenide (InGaAs), indium gallium phosphide (InGaP), indium phosphide (InP), indium antimonide (InSb), gallium arsenide (GaAs), gallium antimonide (GaSb), gallium phosphide (GaP), silicon (Si), and germanium (Ge).

6. The process set forth in claim 3 wherein:
(a) said chosen material is indium phosphide (InP);
(b) said oxygen-containing precursor is molecular oxygen under selected pressure and flow rate conditions; and
(c) said selected wavelength of said radiation is 1849 Å.

7. A low-temperature process for forming a layer of a native oxide of a chosen material on the surface of a substrate of said chosen material while simultaneously minimizing damage to said substrate by charged species or high energy radiation, comprising the steps of:
(a) photochemically generating neutral oxygen atoms at a pressure below atmospheric pressure; and
(b) exposing said substrate at a temperature of about 30 to 300° C. to said neutral oxygen atoms as the primary oxidizing species to cause a chemical reaction between said neutral oxygen atoms and said surface of said substrate to form said native oxide in a manner which avoids said damage to said substrate.

8. The process defined in claim 7 wherein the photochemical generation of said neutral oxygen atoms comprises the direct impingement of a selected oxygen-containing precursor with radiation of a selected wavelength sufficient to cause the direct dissociation of said precursor to generate said neutral oxygen atoms as the sole oxidizing species.

9. The process set forth in claim 7 wherein the photochemical generation of said neutral oxygen atoms comprises the mercury-photosensitized dissociation of a selected oxygen-containing precursor to form said neutral oxygen atoms.

10. A low-temperature process for forming a native oxide on a selected semiconductor material which comprises exposing said material at a temperature of about 30° to 300° C. to a selected oxygen-containing precursor which is irradiated at a pressure below atmospheric pressure with radiation of a predetermined wavelength and sufficient to release oxygen atoms from said precursor, whereby said oxygen atoms in turn react with said material to form said native oxide thereon.

11. The process set forth in claim 10 wherein said radiation causes the direction dissociation of said precursor to release said oxygen atoms.

12. The process set forth in claim 10 wherein said irradiation is performed in the presence of a selected photosensitizer to produce the dissociation of said precursor to release said oxygen atoms.

13. A low-temperature process for forming a native oxide on a substrate of a chosen semiconductor material which comprises:
(a) providing a selected oxygen-containing precursor;
(b) irradiating said precursor at a pressure below atmospheric pressure with radiation of a predetermined wavelength and sufficient to dissociate oxygen atoms therefrom; and then
(c) reacting said oxygen atoms with said substrate at a temperature of about 30° to 300° C. to form said native oxide.

14. The process set forth in claim 13 wherein said precursor is selected from the group consisting of: nitrous oxide ($N_2O$); nitrogen dioxide ($NO_2$); and molecular oxygen ($O_2$) under selected pressure and flow rate conditions.

15. The process set forth in claim 13 wherein said irradiating is performed in the presence of a mercury photosensitizing agent.

* * * * *